United States Patent
Schligtenhorst et al.

(10) Patent No.: US 6,355,971 B2
(45) Date of Patent: *Mar. 12, 2002

(54) SEMICONDUCTOR SWITCH DEVICES HAVING A REGION WITH THREE DISTINCT ZONES AND THEIR MANUFACTURE

(75) Inventors: Holger Schligtenhorst, Eindhoven; Godefridus A. M. Hurkx, Best, both of (NL); Andrew M. Warwick, Stockport (GB)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/257,631

(22) Filed: Feb. 25, 1999

(30) Foreign Application Priority Data

Feb. 28, 1998 (GB) .............................................. 9804177

(51) Int. Cl.[7] .............................................. H01L 29/70
(52) U.S. Cl. ........................ 257/566; 257/578; 257/583; 257/590; 257/592
(58) Field of Search ................................ 257/566, 578, 257/583, 590, 592

(56) References Cited

U.S. PATENT DOCUMENTS

| | | | |
|---|---|---|---|
| 3,507,714 A | 4/1970 | New et al. | 148/186 |
| 3,710,203 A | 1/1973 | Stahr et al. | 317/234 |
| 4,046,609 A | 9/1977 | Dogoy | 148/189 |
| 4,805,004 A | * 2/1989 | Gandolfi et al. | 357/53 |
| 4,975,751 A | * 12/1990 | Beasom | 357/13 |
| 5,548,158 A | * 8/1996 | Bulucea et al. | 257/592 |
| 5,684,322 A | * 11/1997 | Bernier | 257/355 |

OTHER PUBLICATIONS

"Basic Transistor Engineering", Switching Characteristics of Transistors, by Raymond M. Warner, Section 4–8 of Integrated Circuits Design Principles and Fabrication, 1965, McGraw–Hill Book Company.

* cited by examiner

Primary Examiner—Eddie Lee
Assistant Examiner—Matthew E. Warren
(74) Attorney, Agent, or Firm—Steven R. Biren

(57) ABSTRACT

In a semiconductor switch device such as an NPN transistor (T) or a power switching diode (D), a multiple-zone first region (1) of one conductivity type forms a switchable p-n junction (12) with a second region (2) of opposite conductivity type. In accordance with the invention, this first region (1) includes three distinct zones, namely a low-doped zone (23), a high-doped zone (25), and an intermediate additional zone (24). The low-doped zone (23) is provided by a semiconductor body portion (11) having a substantially uniform p-type doping concentration (P−) and forms the p-n junction (12) with the second region (2). The distinct additional zone (24) is present between the low-doped zone (23) and the high-doped zone (25). The high-doped zone (25) which may form a contact zone has a doping concentration (P++) which is higher than that of the low-doped zone (23) and which decreases towards the low-doped zone (23). The distinct additional zone (24) has an additional doping concentration (P+) which is lower than the doping concentration (P++) of the high-doped zone (25) and which decreases towards the low-doped zone (23). This triple-zone formation for the first region (1) permits an improvement in switching behaviour, e.g. in terms of fall-time and energy dissipation during turn-off of the device (T, D). A very low doping (P−) can be used for low-doped zone (23) so that, in the off-state of the device (T, D), this zone (23) and also the additional zone (24) can be fully depleted. The additional zone (24) having its additional doping concentration provides a path for extracting residual charge carriers from the low-doped zone (23) when the device (T, D) is being switched off.

7 Claims, 5 Drawing Sheets

SEMICONDUCTOR SWITCH DEVICES HAVING A REGION WITH THREE DISTINCT ZONES AND THEIR MANUFACTURE

BACKGROUND OF THE INVENTION

This invention relates to semiconductor switch devices (e.g. an NPN switching transistor or a power switching diode) having a switchable reversebiased p-n junction between a first region (such as a p-type base of the transistor or of the diode) of a first conductivity type and a second region (such as a collector or cathode) of an opposite second conductivity type. The invention further relates to methods of manufacturing such a semiconductor switch device.

United States patent specifications U.S. Pat. No. 3,507,714 and U.S. Pat. No. 3,710,203 disclose respectively a power switching transistor and a power switching diode, each of which has a p-type base ("first" region) forming a switchable p-n junction with a second region of an opposite second conductivity type. The second region is an n-type collector region in U.S. Pat. No. 3,507,714 and an n-type cathode region in U.S. Pat. No. 3,710,203. In both the transistor and the diode, the first region includes a high-doped zone having a higher doping concentration of the first conductivity type than a low-doped zone of the first region. In the manufacture of these switch devices, a semiconductor body portion having a substantially uniform doping concentration of the first conductivity type is provided to form the low-doped zone adjacent to the p-n junction, the body portion having a surface located opposite the p-n junction; and a doping step is carried out by doping the body portion over a part of its thickness with dopant characteristic of p-type conductivity through the surface so as to provide the high-doped zone with a doping concentration which decreases towards the low-doped zone. The whole contents of U.S. Pat. No. 3,507,714 and U.S. Pat. No. 3,710,203 are hereby incorporated herein, as reference material.

In the method disclosed in U.S. Pat. No. 3,507,714 the NPN transistor has its base region formed by a uniformly low-doped p-type body portion (wafer) into which the p-type high-doped zone (and also n-type emitter and collector regions) are diffused. This method dates to the late 1960s, i.e. several decades ago. Nowadays it is more conventional to form an NPN transistor from a uniformly low-doped n-type body portion (epitaxial layer) into which the p-type base region and n-type emitter region are diffused. United States patent specification U.S. Pat. No. 4,805,004 discloses a variant NPN transistor in which the p-type base region comprises a uniformly low-doped p-type body portion (epitaxial layer) on a uniformly low-doped n-type body portion (epitaxial layer) of the collector region. The whole contents of U.S. Pat. No. 4,805,004 are also hereby incorporated herein, as reference material.

SUMMARY OF THE INVENTION

It is an aim of the present invention to change the design and manufacture of semiconductor switch devices (such as, e.g. NPN switching transistors and power switching diodes) so as to permit an improvement of their switching behaviour, e.g. in terms of fall-time and energy dissipation during turn-off of the device.

According to one aspect of the present invention, there is provided a semiconductor switch device as set out in claim 1.

According to another aspect of the present invention, there is provided a method of manufacture as set out in claim 7.

As described hereafter in more detail, the inventors have discovered that the switching behaviour can be significantly improved by providing an additional zone with a doping concentration in accordance with the present invention, between the low-doped and high-doped zones of the first region. When the semiconductor switch device is being switched off, it appears that this additional zone provides a low-resistance path for extracting the remaining plasma which is mainly present in the middle of the uniformly low-doped zone towards the end of the discharge period. A significant reduction in fall-time and energy dissipation can be achieved by this means.

The first and second regions may be respective anode and cathode regions of a switching diode. Thus, the high-doped zone of the first region may be provided with an anode contact at the surface, and the second region may be provided with a cathode contact at a surface of the cathode region opposite the anode region.

The first and second regions may be respective base and collector regions of a bipolar transistor. Thus, the body portion of the first conductivity type may be overdoped over a part of its thickness with dopant characteristic of the second conductivity type adjacent to the surface to provide the transistor with an emitter region which forms a p-n junction with the high-doped zone of the base region. The emitter region and high-doped zone of the base region may be provided with respective emitter and base contacts at the surface. The second region may be provided with a collector contact at a surface of the collector region opposite the emitter and base regions.

The present invention is particularly advantageous for so-called "p-base" switching devices, i.e. in which the conductivity type of the first region (and hence its low-doped zone and additional zone) is p-type. The minority charge carriers in a p-type region are electrons which have a high mobility, and so a p-base device constructed in accordance with the invention can have fast switching characteristics. Holes have a much lower mobility than electrons, and so the provision of the low-doped zone on the p-type side of the p-n junction and the provision of the additional zone between the low-doped and high-doped zones of the p-type region permits efficient removal of the holes when switching off the p-base device. Thus, the first region is preferably p-type, and the body portion may be typically of p-type silicon. Boron is a well-established p-type dopant in silicon, and several known boron doping technologies are suitable for providing the desired doping profiles of the low-doped zone, the additional zone and the high-doped zone. Phosphorus and/or arsenic are suitable n-type dopants for regions of opposite conductivity type in silicon. The starting material may be a uniformally boron doped silicon substrate. The switch device may be manufactured without a need for epitaxial growth, by locally doping such a substrate material (a remaining portion of which forms the uniformly low-doped zone) with the respective dopants to form the various regions and zones.

Typically the maximum doping concentration of the additional zone of the first region is one or two orders of magnitude lower than the doping concentration of the high-doped zone. It may be at least an order of magnitude higher than the doping concentration of the low-doped zone. Generally the low-doped zone of the first region has such a low doping concentration as to be depleted by a depletion layer which extends, when the switch device is operated in an off state, from the reverse-biased p-n junction across the thickness of the low-doped zone and into the additional zone of the first region. Indeed, both the additional zone and the low-doped zone may be fully depleted when the switch device is operated in its off state close to its breakdown voltage. In this manner a high blocking voltage can be obtained in the off state of the switch device, while still retaining fast turn-off due to the inclusion of the additional zone. The thickness of the additional zone with its additional doping concentration may be maximised to reduce the voltage drop therein, and the thickness of the low-doped zone may be maximised to increase the breakdown voltage together with the decrease in doping concentration of the additional zone towards the low-doped zone. Typically the thickness of the low-doped zone and the additional zone are of the same order and typically greater than that of the higher-doped zone. Depending on the type of switching device, the conductivity type determining dopant concentration of the high-doped zone may typically exceed $10^{17}$ $cm^{-3}$, whereas that of the additional zone may be between $10^{14}$ $cm^{-3}$ and $5\times10^{15}$ $cm^{-3}$. Typically, the conductivity type determining dopant concentration of the uniformally low-doped zone may be at most $5\times10^{14}$ $cm^{-3}$ and is preferably less than $10^{14}$ $cm^{-3}$.

The multiple zone structure of the first region in accordance with the present invention may be combined with various measures to control the electric field in a peripheral area of the device, in the off-state of the device. Thus, for example, extension zones may be provided at both sides of the reverse-biased p-n junction so as to extend towards each other at a surface of the body in a manner similar to that disclosed in U.S. Pat. No. 4,805,004. An advantageous different measure is described below, in which the p-n junction is extended to the surface adjoined by the first region, and an annular field-relief region of the second conductivity type is present in the low-doped zone of the first region at a location between the additional zone of the first region and the extension of the p-n junction at said surface, so as to control the spread of the depletion layer from the p-n junction.

BRIEF DESCRIPTION OF THE DRAWING

These and other features in accordance with the present invention will now be illustrated in embodiments of the present invention, now to be described with reference to the accompanying drawings, in which.

Figure 1:
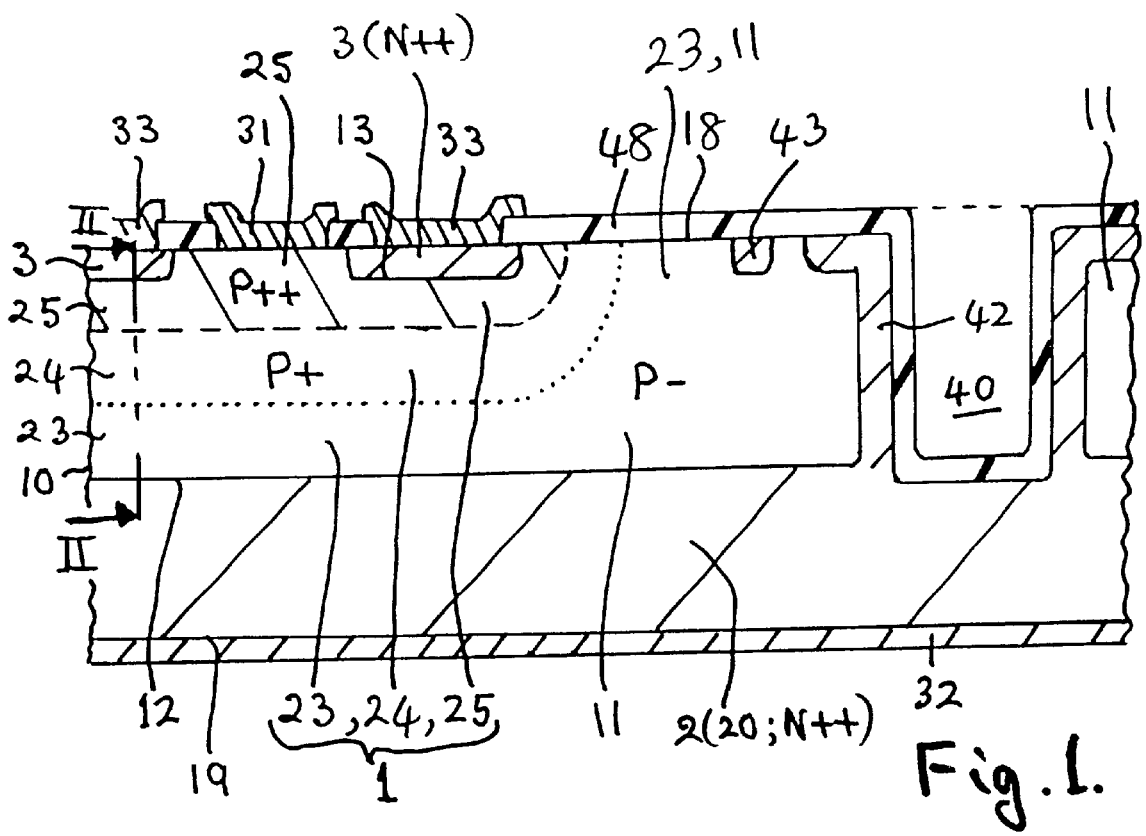
FIG. 1 is a cross-sectional view of an active and peripheral area of one particular example of a NPN bipolar switching transistor in accordance with the invention, manufactured by a method in accordance with the invention.
Figure 9:
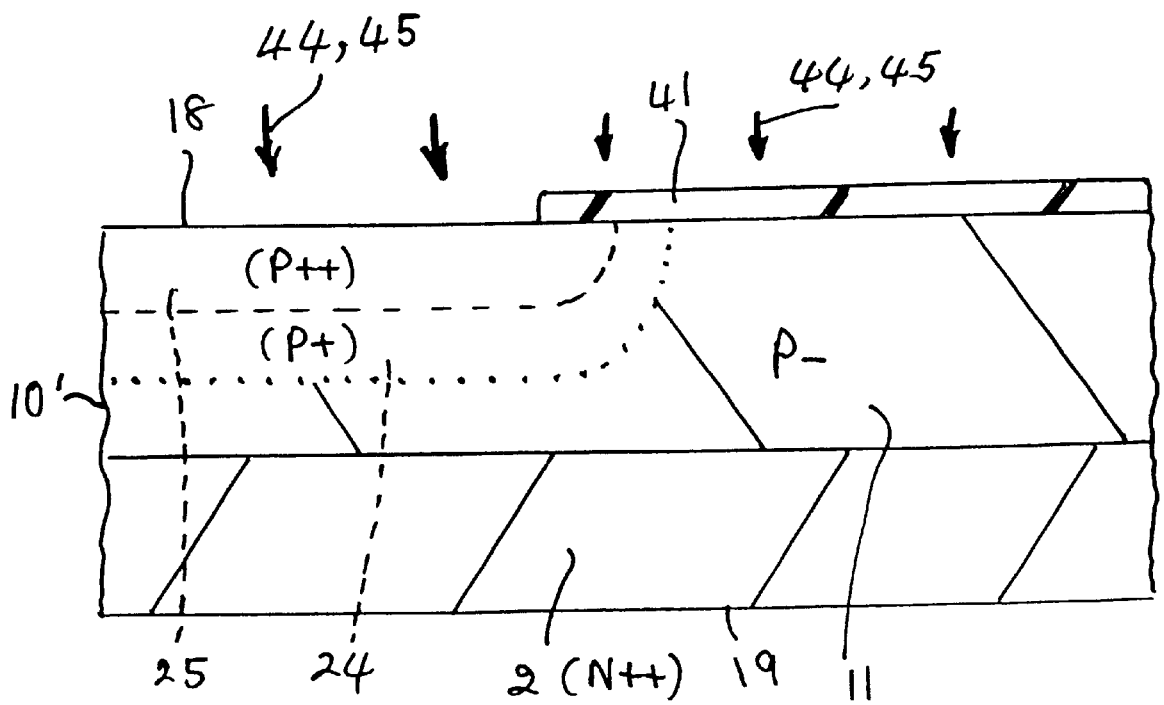
FIG. 9 is a cross-sectional view of the transistor body of FIG. 1, at a stage during manufacture by a method in accordance with the present invention.
Figure 3:
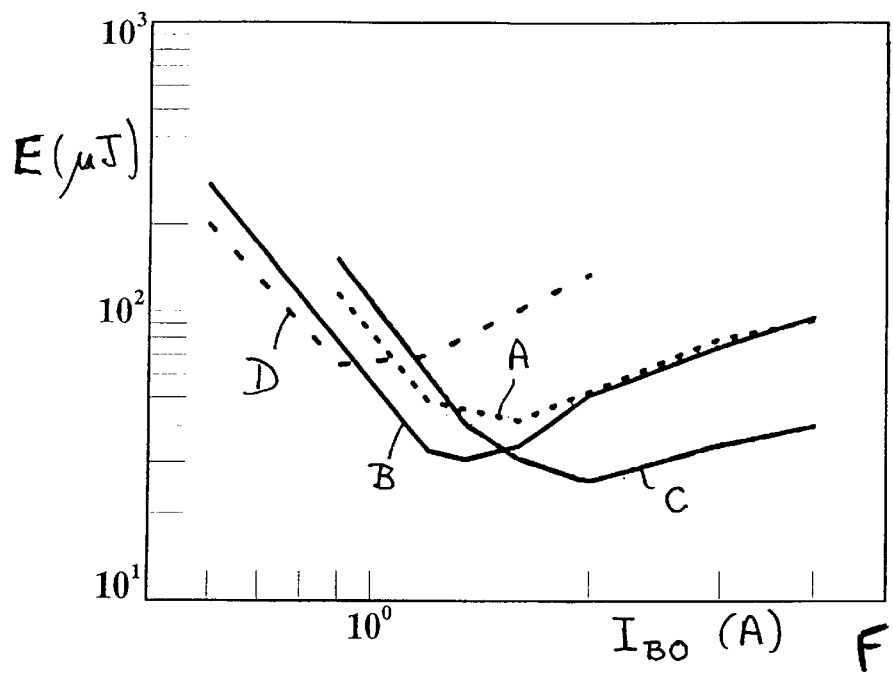
FIG. 3 is a plot of energy dissipation E in microJoules (μJ) as a function of base current $I_{B0}$ in Amperes (A) for the transistor of FIG. 1 (case C) and for three comparative prior-art NPN transistor structures (cases A, B and D)
Figure 4:
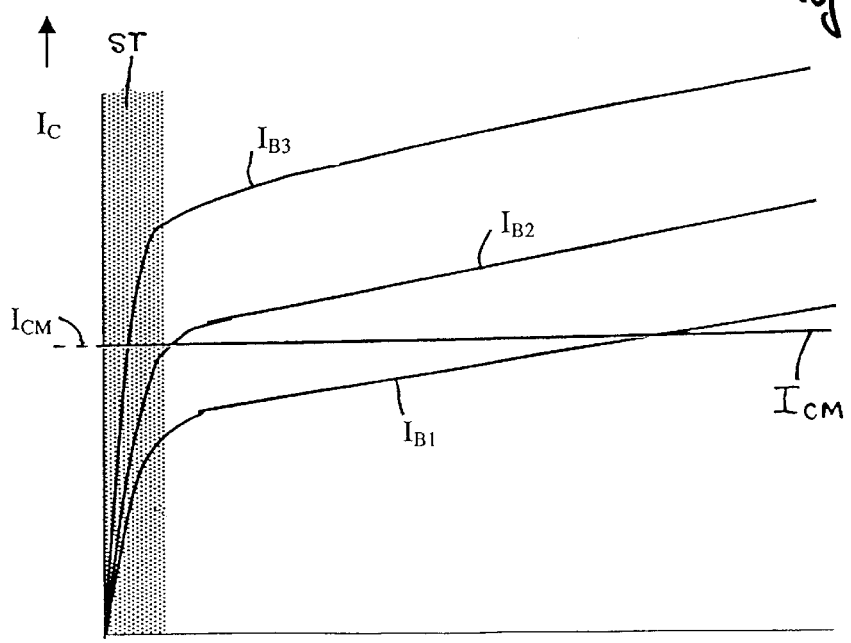
FIG. 4 is a schematic representation of the dc output characteristics of such a transistor, in terms of the variation of its collector current $I_C$ with collector-emitter voltage $V_{CE}$, for three values of base current $I_{B1}$, $I_{B2}$, and $I_{B3}$.

It should be noted that FIGS. 1, 4 and 9 are diagrammatic and not drawn to scale. Relative dimensions and proportions of parts of FIGS. 1 and 9 have been shown exaggerated or reduced in size, for the sake of clarity and convenience in the drawings. The plots of FIGS. 2, 3, 6, 7 and 8 are derived from a computer model for NPN bipolar switching transistors. The same reference signs are generally used to refer to corresponding or similar features in different embodiments.

DESCRIPTION OF THE PREFERRED EMBODIMENTS

Figure 2:
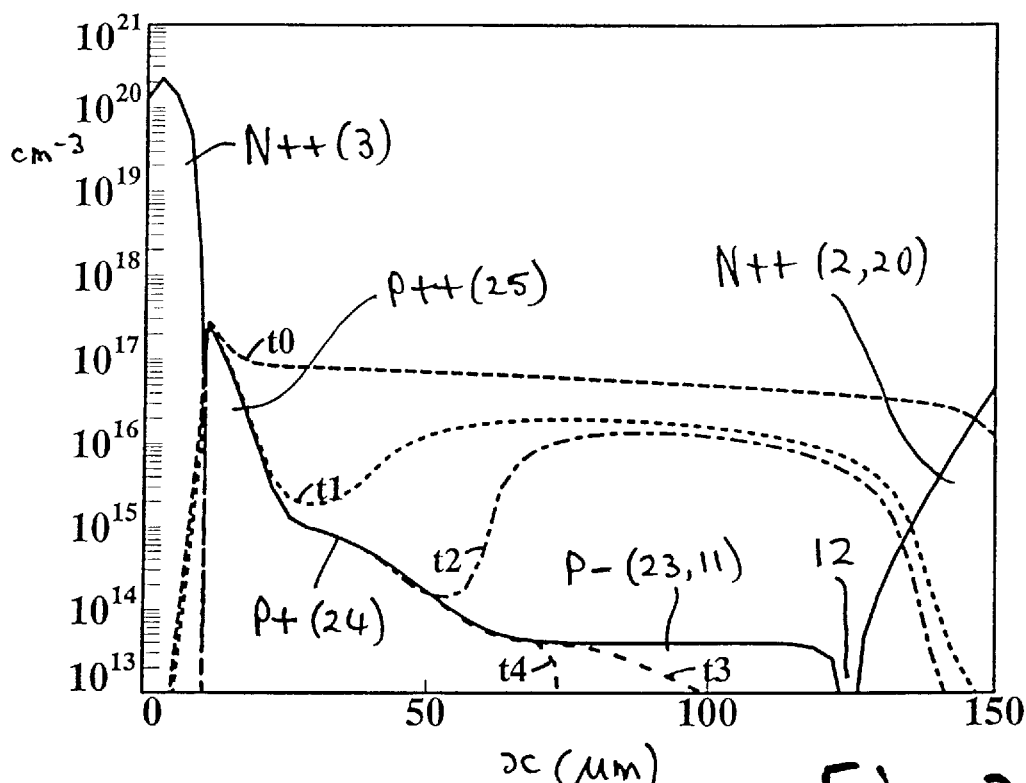
FIG. 2 is a plot of doping profile (N++. P++. P+, P−, N++) and hole dissipation (at times t0, t1, t2, t3 and t4) in $cm^{-3}$ as a function of depth x in μm (micrometres) on the section line II—II in FIG. 1, vertically through the active area of the emitter, base and collector regions of the transistor.

The NPN bipolar switching transistor T of FIGS. 1 and 2 is an example of a semiconductor switch device having a switchable reverse-biased p-n junction 12 in a monocrystalline silicon semiconductor body 10, between a multiple-zone first region 1 (23,24,25) of p-type conductivity type and a second region 2 (20) of n-type (i.e. of an opposite second conductivity type). In the transistor embodiment of FIGS. 1 and 2, the p-n junction 12 is a collector junction, the first region 1 (23,24,25) is a p-type base region, and the second region 2 (20) is an n-type collector region of the transistor T. An n-type emitter region 3 is provided in the base region 1 to form an emitter junction 13 of the transistor. The base region 1 and emitter region 3 are contacted by base and emitter contacts 31 and 33 respectively at a major surface 18 of the body 10. In a specific examplary embodiment, the emitter region 3 may have a known finger-type layout geometry, with the base and emitter contacts 31 and 33 comprising interdigited fingers. The p-n junction 12 extends parallel to the surface 18, and so the junction 12 and surface 18 are located opposite each other across the base region 1. The collector region 2 is a high-doped n-type region 20 which adjoins the opposite major surface 19 of the body 10 where it is contacted by a collector contact 32.

The fundamentals for design, characteristics and operation of NPN bipolar switching transistors were established long ago. An early but convenient overview is given in the Basic Transistor Engineering—Switching Characteristics of Transistors section 4–8 of Integrated Circuits Design Principles and Fabrication, Editor: Raymond M. Warner, published 1965 by the McGraw-Hill Book Company, and the whole contents of which are hereby incorporated herein as reference material. The transistor T is switched on and off by a control signal applied to its base contact 31. In the off-state, both the emitter and collector junctions 13 and 12 are reverse biased by this control signal. When the transistor is switched into saturation in the on-state, both the emitter and collector junctions 13 and 12 of T become forward biased, due to a high density of minority carriers (electrons) injected into the p-type base region 1.

In accordance with the present invention, the base region 1 of the NPN transistor of FIGS. 1 and 2 includes three distinct zones 23,24,25, namely: a low-doped zone 23, a high-doped zone 25, and an additional zone 24. The low-doped zone 23 is provided by a semiconductor body portion 11 having a substantially uniform p-type doping concentration P−. This zone 23 forms the p-n junction 12 with the collector region 2(20). The other distinct zones 24 and 25 are sequentially present between the low-doped zone 23 and the major surface 18, in the active area of the device. The high-doped zone 25 has a p-type doping concentration P++ which is higher than that of the low-doped zone 23 and which decreases towards the low-doped zone 23 over a part of the thickness of the body 10. The distinct additional zone 24 has an additional p-type doping concentration P+ which is lower than the p-type doping concentration P++ of the high-doped zone 25 and which decreases towards the low-doped zone 23.

This triple-zone formation of the base region 1 permits the use of a very low doping P− for low-doped zone 23 so that, in the off-state of the transistor T, the zone 23 can be fully depleted by a depletion layer which extends from the reverse-biased collector junction 12 across the thickness of the low-doped zone 23 and into the additional zone 24 of the base region 1. Preferably the zone 24 is also fully depleted by this depletion layer, when the transistor T is operated near breakdown. Thus, in the off-state of T, the depletion layer from the reverse-biased collector junction 12 (which also extends marginally into the more highly doped collector region 2) may be substantially co-extensive with the zones 23 and 24 in FIG. 1; for this reason the outline of this depletion layer is not depicted in FIG. 1, but the zones 23 and 24 are depicted without hatching in FIG. 1. As described hereinafter, the additional zone 24 having its additional doping concentration provides a path for extracting residual charge carriers from the low-doped zone 23 when the transistor switch is being switched off.

Figure 5:
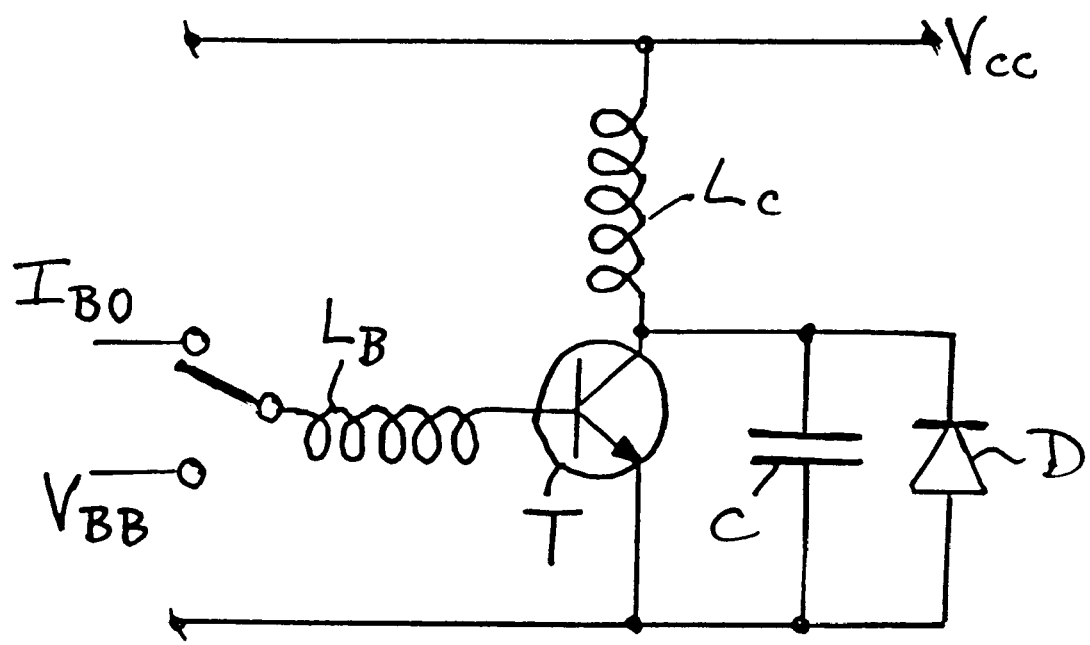
FIG. 5 is a circuit diagram of the NPN bipolar switching transistor and a HV (high voltage) switching diode in a horizontal deflection circuit for a television display, for simulating the switching off of the transistor.

FIG. 5 is a circuit diagram for simulating the switching behaviour of the PNP transistor T in a horizontal deflection circuit for a television display. The deflection coil of the display is coupled to the collector (contact 32) of T, and this coil is represented by inductor $L_C$ in FIG. 5. The transistor T in a common-emitter configuration is switched by a pulse which is applied to its base (contact 31). This base pulse is represented for the FIG. 5 simulation by switching between a base current $I_{B0}$ in the on-state of T and a bias voltage $V_{BB}$ in the off-state of T. The switch together with an inductor $L_B$ represents the base drive circuit of T in the simulation.

The circuit produces a sawtooth type of current $I_C$ through the deflection coil $L_C$. The transistor T conducts the positive current $I_C$, and the negative part of the current is conducted by a PN switching diode D which is coupled between the base and emitter (i.e. between contacts 31 and 33) of T. Capacitor C forms an LC oscillator with $L_C$ when both T and D are in the OFF state. This LC oscillator drives $V_{CE}$ to negative values such that D is switched on. For simulating the switching behaviour of T, the various components of the FIG. 5 circuit have the following values:

$$V_{CC} = 150 \text{ V}$$
$$L_C = 1 \text{ mH}$$
$$C = 13 \text{ nF}$$
$$L_B = 6 \text{ μH}$$
$$V_{BB} = -4 \text{ V}$$

The diode D is in the off state when the transistor T is switched off, and so the characteristics of D need not be taken into account in simulating the switching off of T.

Figure 6:
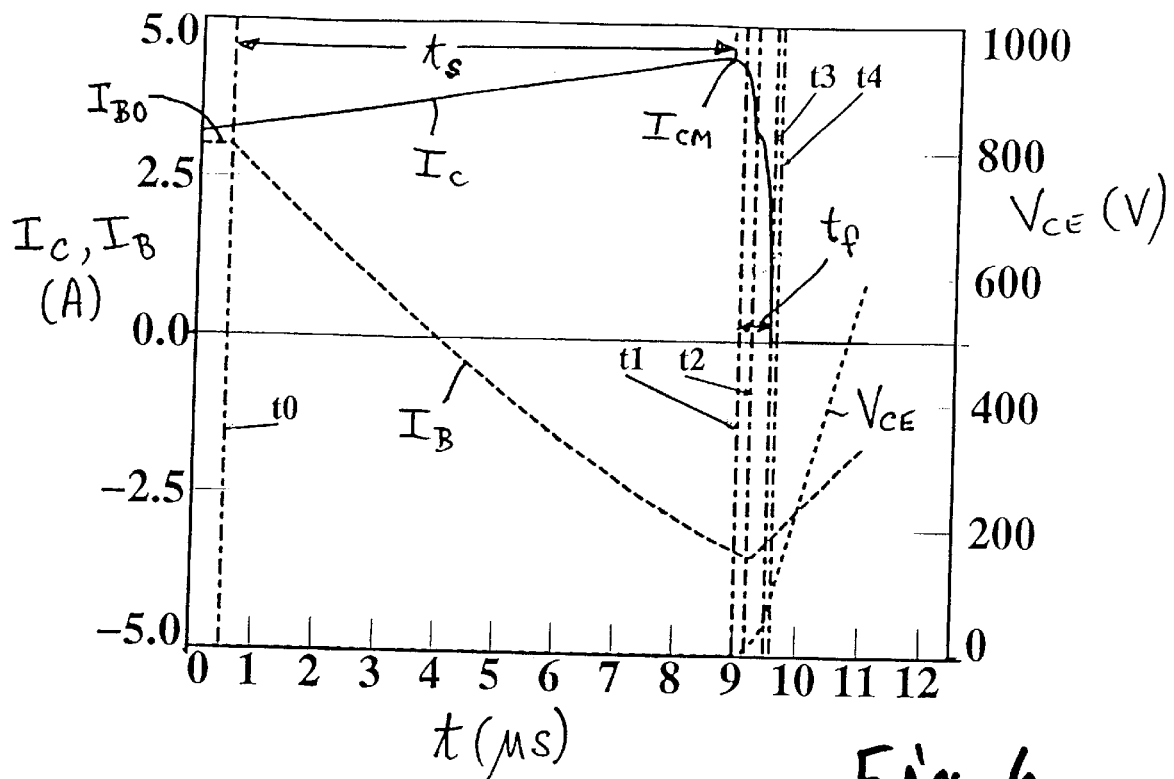
FIG. 6 is a plot of the switching characteristics of the NPN bipolar switching transistor of FIG. 2 in terms of the variation of collector and base currents $I_C$ and $I_B$ in Amperes (A) and collector-emitter voltage $V_{CE}$ in volts (V), with time t in μs (microseconds) in the FIG. 5 circuit.

The behaviour of the base current $I_B$, collector current $I_C$ and collector voltage $V_{CE}$ of T during turn off is shown in FIG. 6. The time interval $t_s$ (the so-called "storage time") is the interval from when $I_B$ starts to decrease at t0 until $I_C$ starts to decrease from its maximum value $I_{CM}$. This interval $t_s$ is related to charge-storage phenomenon in the base and collector regions 1 and 2. The time interval $t_f$ is the so-called "fall time" and is the subsequent time interval over which $I_C$ decreases until T enters the off-state. Typically $t_f$ may be defined as the interval during which $I_{CM}$ falls from 90% of $I_{CM}$ to 10% of $I_{CM}$ The slope of $I_C$ during $t_s$ is determined by the voltage drop across the collector inductor $L_C$, which initially is virtually equal to $V_{CE}$. The slope of $I_C$ during $t_f$ is dependent on the base-collector region structure, as illustrated later in the comparison of FIGS. 6 and 8.

The time sequence of FIG. 6 can be understood as follows:

at t=t0, the base is switched from $I_{B0}$ to $V_{BB}$, and the base starts being discharged; the base current $I_B$ starts to fall.

at t=t0 +$t_s$, excess carriers are removed from the base region 1, and the emitter junction 13 is no longer forward-biased, and so the collector current $I_C$ is at $I_{CM}$. FIG. 6 (and FIG. 2) indicate the slightly later time t1, when $I_C$ is starting to decrease from $I_{CM}$ Due to base inductance $L_B$, the emitter junction 13 is entering avalanche breakdown. The base current $I_B$ falls to a minimum (reached at t2), but after t=t2:

part of the base current is now provided by the avalanche process, and so $I_B$ now increases. The slope of the now-increasing $I_B$ is determined by the base-emitter breakdown voltage $BV_{EBO}$, i.e. $dI_B/dt=(BV_{EBO}-V_{BB})/L_B$.

$V_{CE}$ is now rising as the collector current $I_C$ falls (the base-emitter junction 13 being no longer forward biased). The behaviour of $I_C$ and $V_{CE}$ in this region is determined by $L_C$ and capacitor C.

the fall time $t_f$ is determined by the stored excess carriers at t=(t0+$t_s$) in the base and collector regions 1 and 2, and particularly the holes with their lower mobility.

because $V_{CE}$ increases rapidly during the fall of $I_C$, power is dissipated during this switching cycle.

This power dissipation during $t_f$ is a main issue which the present invention addresses. For faster switching circuits, the power dissipation would rise if the energy dissipation during switching were to remain the same. Thus, in order to keep the power dissipation low for faster circuits, the energy dissipation per circle has to be reduced.

The simulated energy dissipation during turn-off of a transistor T in the FIG. 5 circuit is indicated in the plots of FIG. 3 for different NPN transistor structures, for which $I_{CM}$ is the same ($I_{CM}$=4.5A) in each case A, B C and D. Due to its shape, this type of plot is called a "bath-tub" curve. The increase in energy dissipation to the right-hand side (higher $I_{B0}$) of the minimum is caused by the discharge process of excess carriers during the fall time $t_f$. The responsible effects contributing to the energy dissipation in the different regions of the bath-tub curve can be explained as follows, with reference also to the three $I_C$—$V_{CE}$ curves of FIG. 4:

the left-hand side of the bath-tub curve (for values of $I_{B0}$ which are lower than $I_{B0}$ at minimum dissipation)

relates to switching the transistor from an under-driven on-state in which the base current $I_{B0}$ is low (such as from $I_{B1}$ in FIG. 4). In this case, the under-driven transistor T is out of saturation (region ST of FIG. 4) before switching off (i.e. t<$t_s$); a high value of $V_{CE}$ is needed to reach a required maximum collector current $I_{CM}$. This leads to a high dissipation before t=t0 +$t_s$. The required value of $V_{CE}$ (and hence the dissipation) increases with decreasing $I_{B0}$ and with increasing $I_{CM}$. At these high values of $V_{CE}$ the transistor is out of saturation and quasi-saturation, and few excess carriers are present in the base and collector regions 1 and 2. Hence the fall time $t_f$ is short and the energy dissipation which occurs during that time is low.

the right-hand side of the bath-tub curve (for values of $I_{B0}$ which are higher than $I_{B0}$ at minimum dissipation) relates to switching the transistor T from an over-driven on-state in which it is heavily in saturation (such as from curve $I_{B3}$ in FIG. 4). In this case, the over-driven transistor T does not come out of saturation (region ST of FIG. 4) to reach the required $I_{CM}$. Hence very many excess carriers are present in the base and collector regions 1 and 2, and so $t_f$ is long and the energy dissipation which occurs during that time is high. The turn-off time at a given $I_{CM}$ increases with increasing $I_{B0}$, because for higher $I_{B0}$ the transistor is in even stronger saturation. For a given $I_{B0}$, $V_{CE}$ is lower for lower $I_{CM}$, and so the transistor is in stronger saturation for lower $I_{CM}$ and, hence, $t_f$ is larger. Thus, contrary to the situation at low $I_{B0}$, the dissipation at a given $I_{B0}$ increases with decreasing $I_{CM}$.

the minimum of the bath-tub curve lies at a value for $I_{B0}$ which is just high enough to bring the transistor out of saturation at $I_C=I_{CM}$ (i.e. around curve $I_{B2}$ in FIG. 4). In this case, no high $V_{CE}$ is needed to reach $I_{CM}$, and $t_f$ is short because the transistor is just out of saturation.

The best turn-off performance (i.e. with least energy dissipation) for a NPN transistor is obtained by forming the transistor as in FIGS. 1 and 2 in accordance with the present invention, on uniformly p-type doped substrate material 11 (for base zone 23) together with the two higher doped (double-diffused) base zones 24 and 25, i.e. case C in FIG. 3. The variation in doping profile for this case is illustrated by the particular example shown in FIG. 2 for two boron diffusions in accordance with FIG. 9. The base region 1 comprises three distinct zones 23, 24 and 25, and so its doping profile exhibits distinct transitions in doping gradient from zone 25 to zone 24 and from zone 24 to zone 23. Thus, in the example of FIG. 2, the boron doping P++ of zone 25 decreases progressively from about $3 \times 10^{17}$ cm$^{-3}$ at the emitter junction 13, the boron doping P+ of zone 24 decreases progressively from about $1.5 \times 10^{15}$ cm$^{-3}$ at its interface with zone 25, and zone 23 has a uniform boron doping of about $4 \times 10^{13}$ cm$^{-3}$. In the particular example illustrated in FIG. 2 and forming the basis for the simulation model, the emitter junction 13 is at a depth x of about 9 μm, the interface between zones 25 and 24 is at a depth x of about 25 μm, the interface between zones 25 and 24 is at a depth x of about 55 μm, and the interface between zone 23 and region 2 (i.e. the collector junction 12 of FIG. 1) is at a depth x of about 140 μm from the surface 18.

The FIG. 1 transistor structure having this FIG. 2 doping profile in accordance with the invention is contrasted with three prior-art types of NPN transistor structure, namely cases A, B and D. In case A, the additional zone 24 is omitted and so the p-type high-doped zone 25 interfaces directly with the uniformly p-type doped zone 23. In case B, a uniformly n-type doped ($4 \times 10^{13}$ cm$^{-3}$) substrate zone 22 is adopted instead of the p-type substrate zone 23 of FIG. 1, i.e. the transistor base consists of p-type zones 24 and 25 and the transistor collector consists of n-type zones 22 and 20. In case D, the transistor base consists only of p-type zone 25, and the transistor collector consists of n-type zones 22 and 20 (i.e. the same collector as in case B in which a uniformly n-type doped ($4 \times 10^{13}$ cm$^{-3}$) substrate zone 22 is adopted instead of the p-type substrate zone 23 of FIG. 1). The buried collector junction depth in each case A, B, C, and D is so chosen that the transistors in all four cases have the same $BV_{CBO}$.

From FIG. 3 it can be seen that the turn-off behaviour in terms of energy dissipation is significantly improved by having the triple base zones 23, 24 and 25 in accordance with the invention (case C in FIG. 3), as compared with all the other cases A, B and case D. The minimum of the energy dissipation curve for case C is found to be less than for the prior-art structures (cases A and B) and is shifted somewhat to higher base currents $I_{B0}$. The dissipation curve for case C is also clearly widened for high base currents $I_{B0}$, which means that, for high base currents, the energy dissipation during one switching cycle is less dependent on the actual magnitude of the base current.

For the FIG. 1 transistor in accordance with the invention, i.e. for case C of FIG. 3, FIG. 2 shows (in addition to the doping profile) the hole concentrations at the different times t0, t1, t2, t3 and t4 of FIG. 6. It is important to note that the base zones 23 and 24 are fully flooded with electron-hole plasma when the transistor is in its on-state. Thus, these zones 23 and 24 should not usually be made thicker than needed to meet the specified breakdown voltage, because an increase in their thickness increases the amount of stored charge. Another important point is that because the holes have a much lower mobility than electrons, the voltage drop is built up at the side of the low-doped zone nearest the p-type contact zone 25. This is a general property of the discharge of power p-n junction devices with a low-doped zone (e.g. 23 and/or 22) adjacent to the p-n junction. Furthermore the hole current is highest around t=(t0+$t_s$) and decreases rapidly to zero between t=(t0+ts) and t=(t0+$t_s$+$t_f$), as can be seen from FIGS. 2 and 6. After the emitter junction 13 has become reverse biased, the hole current then equals the collector current. The difference between the hole extraction current and the collector current is delivered by avalanche multiplication in the emitter junction 13.

Figure 7:
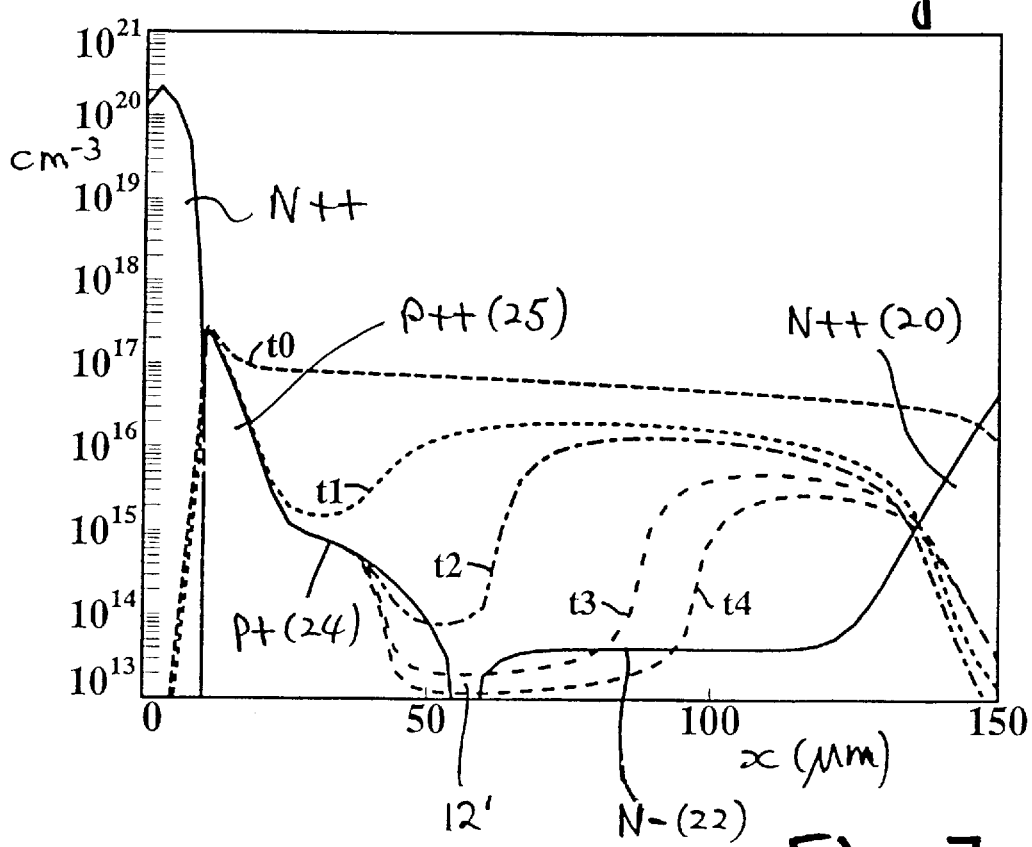
FIG. 7 is a plot (similar to FIG. 2) of a doping profile (N++. P++. P+. N−, N++) and hole dissipation (at times t0, t1, t2, t3 and t4) in $cm^{-3}$ as a function of depth x in μm (micrometres) for a prior-art variant of the FIG. 1 transistor, corresponding to case B of FIG. 3.
Figure 8:
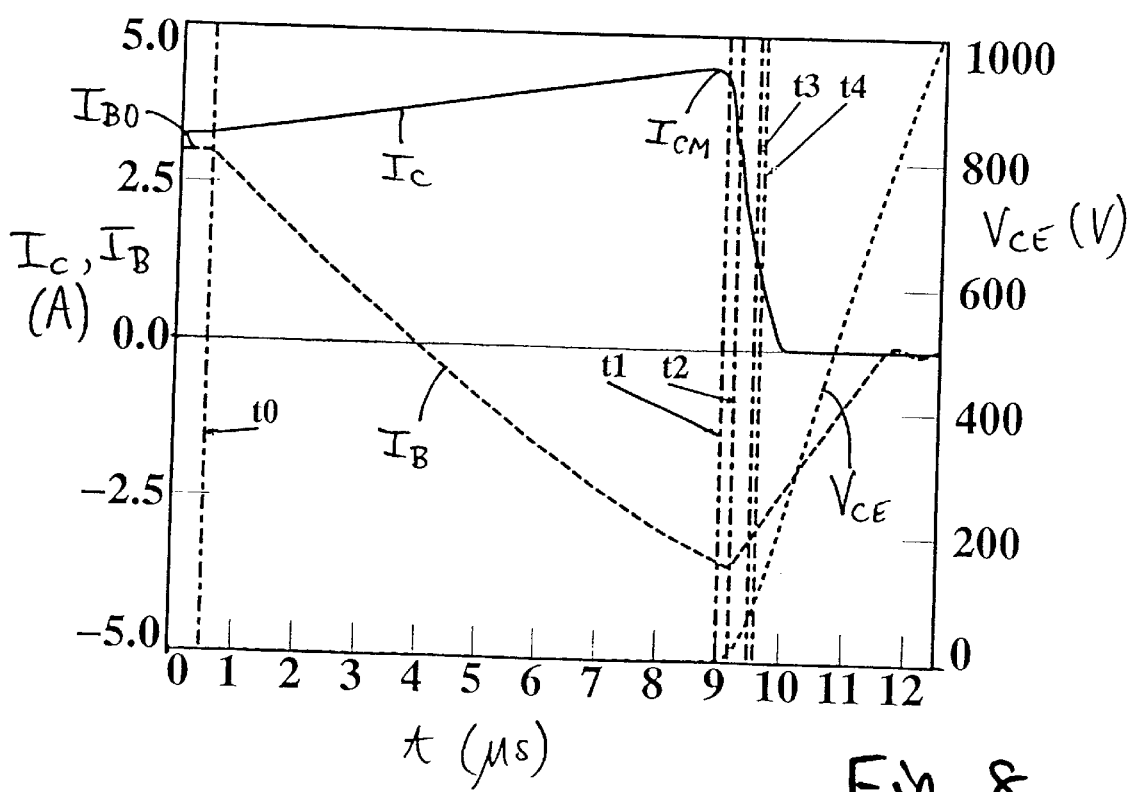
FIG. 8 is a plot (similar to FIG. 6) of the switching characteristics of the prior-art variant transistor of FIG. 7 (case B of FIG. 3) in terms of current variations $I_C$ and $I_B$ in Amperes (A) with time t in μs (microseconds) in the FIG. 5 circuit.

FIGS. 2 and 6 relate to the invention case C, but similar plots are given in FIGS. 7 and 8 for the prior-art case B. In both cases the transistor was switched off from a base current of $I_B$=3A. At t=t0, the stored charge is of the same magnitude for both cases B and C. The carrier distributions for both cases are also still similar at t=t1, comparing zones 23 and 24 of case C with zones 22 and 24 of case B.

The discharge process for both cases B and C can be followed from FIGS. 2 and 7. As long as the p-type base region is being discharged, the associated voltage drop is given by the multiple of the hole current and the series resistance of the empty part of the base. Because the extraction current is highest at t=(t0+$t_s$) and shortly afterwards, the voltage drop is kept low by making the doping level of base zone 24 to have its high value near the base contact zone 25. When the extraction process progresses the extraction current decreases, and so the doping level can decrease towards the zone 23 in case C (and towards zone 22 in case B). This decreasing doping level is advantageous in terms of the depletion of both zones 23 and 24 in the off-state of the transistor, i.e. the breakdown voltage.

After time t2 the left-hand edge of the electron-hole plasma reaches the N− zone 22 in the prior-art case B transistor. Further discharge of the case B transistor now separates the electron-hole plasma from the p-type base region 24,25, and so a depletion layer is built up at its collector-base junction 12'. The case B transistor therefore has the problem that the remaining holes have to be removed through this depletion layer. The associated voltage drop (e.g. at times t3 and t4) in the case B transistor is given by the width of this depletion layer (which increases as the discharge progresses) and the space charge in the depletion layer. In the case C transistor in accordance with the invention, the high specific resistance of the P− zone 23 causes a voltage drop when the left-hand side of the electron-hole plasma enters the zone 23 after t2, because the holes are removed through the neutral part of the zone 23. Although it increases with further discharge, this voltage drop for the case C transistor is much lower than for the case B transistor for a given location of the left-hand edge of the plasma from zone 24, i.e. for a given amount of remaining holes.

This major difference in the voltage drop between cases B and C can be understood in terms of the ionized donor dopant in the depletion layer of case B having a positive charge which adds to the positive charge of the holes to be extracted, whereas the ionized acceptor dopant in the depletion layer of case C has a negative charge which compensates the positive charge of the holes to be extracted. This results in a shorter recovery time and a reduced energy dissipation for the case C transistor in accordance with the invention. A comparison of the fall-off of $I_C$ in FIGS. 8 and 6 shows the much longer fall time $t_f$ (longer than t4) for the prior-art case B transistor as compared with the case C transistor in accordance with the invention.

The discharge process in the prior-art transistor cases A and D can be followed as respective modifications of FIGS. 2 and 7, while omitting the role of the additional zone 24 in their respective base regions 25,23 and 25. The double diffused base profile (zones 24 and 25) which is adopted for transistors in accordance with the present invention (together with a low-doped p-type P− substrate base zone 23) is extremely beneficial in terms of its influence on the base series-resistance vertically across the thickness of the base region 1. Thus, the somewhat higher doping arising from the inclusion of zone 24 of the double-diffused base profile (zones 24 and 25) reduces the vertical series-resistance, when the remaining plasma during the discharge process is mainly present in the middle of the low-doped base zone 23 (at t2 and afterwards), i.e. when the discharge current has to be maintained by charge carriers in the outer zones 24 and 25 of the base region 1.

By comparing the energy dissipation curves in FIG. 3, it can be seen that the combination of a double-diffused p-type base profile (zones 24 and 25) with a low-doped p-type (P−) substrate zone 23 (i.e. case C in accordance with the invention) is beneficial for the transistor switching behaviour. The improvement over prior-art cases A and D (as well as that over case B) can also be seen from the bath-tub curves of FIG. 3.

Case A in FIG. 3 shows that a comparable transistor performance cannot be achieved with a low-doped p-type (P−) substrate (zone 23) without the additional zone 24 of the double-diffused base profile. In case A the zone 24 is omitted, and so the base region 1 consists only of the two zones 23 and 25. Case D in FIG. 3 shows that a comparable transistor performance cannot be achieved with a low-doped n-type (N−) substrate (zone 22) without the additional zone 24 of the double-diffused base profile. In case D the zone 24 is omitted, and so the base region 1 consists only of the zone 25. When switching from high $I_{BO}$, the energy dissipation for prior-art case A based on a P− substrate is comparable to the prior-art case B transistor based on an N− substrate. However, cases A and B differ at low $I_{BO}$ and at the minimum dissipation. The vertical base resistance for the case A transistor (without the additional base zone 24) is higher than for the double-diffused base cases B and C. Furthermore FIG. 3 compares curves for the prior-art case A transistor on P− substrate with a prior-art transistor of case D which has an N− substrate with a shallow P++ base region 25 only. It can be seen from this comparison that the transistor behaviour is improved by simply using a p-type (P−) substrate instead of an n-type (N−) substrate. However, the case C curve shows how this improvement is surpassed by adopting a transistor structure in accordance with the invention, with a double-diffused base structure 24,25 on a p-type (P−) substrate 23.

FIG. 9 illustrates base-doping steps in the manufacture of the NPN transistor of FIGS. 1 and 2. Preferably, the starting material for this FIG. 9 embodiment is a silicon semiconductor body in the form of a very lowly doped p− type substrate 10' having, for example, a uniform boron doping of the order of $10^{13} cm^{-3}$. At least a part of the collector region 2 is formed by overdoping a portion of the p-type substrate 10' to form the p-n junction 12 with the remaining p-type body portion 11. This permits the low-doped zone 23 of the base region 1 to be formed by a remaining very lowly doped p-type body portion 11 of the substrate 10' Thus, phosphorus or arsenic may be diffused into the whole of the back surface 19 of this p-type substrate 10' to provide the highly doped n-type region 20 for the collector region 2 of the transistor. This n-type dopant diffusion may be carried out at opposite major surfaces of a semiconductor wafer which is subsequently cut (for example by sawing and then polishing) parallel to these major surfaces so as to form two substrates 10' each having the high-doped n-type region 20 at one major surface 19 and the remaining low-doped p-type body portion 11 (for zone 23) at its newly-exposed, opposite major surface 18. Thus, no epitaxial growth process is necessary.

As illustrated schematically by arrows 44 and 45 in FIG. 4, localised doping of the remaining low-doped p-type body portion is now effected through the major surface 18, over a part of the thickness of the body portion 11. This localised doping consists of two doping steps, one to form the high-doped zone 25 and the other to form the intermediately-doped, deeper zone 24. These two doping steps (each of which may use boron as the dopant) can be carried out by known techniques of implantation and/or deposition and then thermal diffusion. Both doping steps can be carried out in known manner using, for example, a silicon dioxide layer pattern 41 as a mask on the major surface 18. The doping 45 for the zone 25 may be done before or after the doping 44 for the zone 24, and/or both may be diffused simultaneously from previous implants.

The zones 23 and 24 are so constructed that together they have a width and doping level such that both are fully depleted at voltages approaching breakdown. While avoiding an excess thickness (which would unnecessarily increase the stored charge and the resistance of the current path), the zone 24 with its decreasing doping concentration is made as thick as possible. Typically the thicknesses of zones 23 and 24 are of the same order. The maximum doping level of zone 24 is typically one or two orders of magnitude lower than the doping concentration arising from the adjacent high-doped zone 25 and one order of magnitude higher than the doping concentration of zone 23.

In order to passivate the periphery of the collector junction 12 at the major surface 18, a groove 40 may be etched into the p-type body portion from the surface 18, with an annular geometry so that the groove 40 surrounds the base region 1. The p-type body portion 11 (which forms the zone 23) may then be peripherally overdoped along the side-walls of the groove 40 with n-type dopant (for example arsenic) to form an n-type annular region 42 which surrounds the p-type base zone 23 and reaches to the collector region 2 so as to extend the p-n junction 12 to the surface 18. The same doping step that is used to form the annular region 42 may be used to provide simultaneously the emitter region 3 which forms the p-n junction 13 with the high-doped zone 25 of the base region 1.

Simultaneously with the formation of the regions 3 and 42, this doping step may also be used to provide one or more annular field-relief regions 43 in the low-doped zone 23 at a location between the zone 24 and the collector junction extension at the suface 18. These field-relief regions 43, spaced from the zone 24, may be of an annular configuration surrounding the zone 24 at the surface 18, and they are located within the spread of the depletion layer in the zone 23 from the extended collector junction 12. The major surface 18 and the side-walls of the groove 40 can be passivated subsequently with an insulating layer 48 of, for example, silicon dioxide. The emitter region 3 and the high-doped zone 25 of the base region 1 are contacted at windows in the insulating layer 48 by a metallisation pattern (for example of aluminium) to provide the base and emitter contacts 31 and 33.

The annular groove 40 surrounds a large active area of the device where the transistor structure is present. FIGS. 1 and 4 illustrate only a small, peripheral area of the transistor T. Generally a power switching transistor T has a large number of emitter regions 3 (for example in a matrix or finger pattern) diffused in one or more common base regions 1 and may have, for example, interdigitated emitter and base contacts 33 and 31. In accordance with the present invention the or each common base region 1 of such a transistor T can comprise the vertical multiple-zone structure 23,24,25 of FIGS. 1 and 2.

Many modifications and variations are possible within the scope of the present invention. Thus, for example, epitaxial growth could be used. Instead of starting with a p-type substrate 10', the low-doped p-type body portion 11 (for zone 23) may be provided by a p-type epitaxial layer which is deposited on the collector region 2. In the embodiment of FIG. 1, the collector region 2 consists solely of the high-doped n-type region 20. However, an NPN transistor in accordance with the present invention may comprise a two-part collector region 2 which comprises, for example, a low-doped n-type zone 22 between the low-doped p-type zone 23 of the base region 1 and the high-doped n-type region 20 of the collector region 2. Thus, for example, the low-doped base zone 23 may be a p-type epitaxial layer 11' deposited on an n-type epitaxial layer 22' deposited on a high-doped n-type substrate 20. There is then a degree of freedom in the choice of the relative thicknesses (widths) $W_p$ and $W_n$ of the respective p-type and n-type low-doped zones 23 and 22 provided by the two epitaxial layers. However, because the minimum of the energy dissipation curve C in FIG. 3 is lowest for the transistor case C with the p-type (P−) substrate zone 23 (rather than for case B with the n-type (N−) substrate zone 22), it is expected that the minimum energy dissipation for a correct optimisation will be found for a NPN transistor as in FIGS. 1 and 2, in which $W_p$ is maximised and $W_n$ is zero.

The device embodiment of FIG. 1 is an NPN switching transistor. However, the present invention may be used to form other types of semiconductor switch device, for example a HV power switching diode. In this case, the p-type and n-type regions 1 and 2 may be respective anode and cathode regions of the diode. The anode region 1 then comprises a high-doped zone 25, a distinct intermediately-doped zone 24, and a low-doped base zone 23, all of p-type conductivity. The switchable p-n junction 12 is formed between the low-doped p-type base region 23 (formed by the body portion 11) and the n-type cathode region 2. The high-doped zone 25 is provided with an anode contact 31 at the major surface 18, whereas the n-type (second) region 2 is provided with a cathode contact 32 at the major surface 19 of the cathode region 2 opposite the anode region 1. The diode may, for example, have a structure similar to that of FIG. 1, except that the region 3 and contact 33 are absent in the diode. Such a high-voltage switching diode having a doping profile in accordance with the present invention may form, for example, the switching diode D in the FIG. 5 circuit.

In the embodiments so far described, the region 1 is of p-type conductivity. However, embodiments of the present invention are also possible in which the region 1 (with its distinct zones 23, 24 and 25) is of n-type conductivity, and the region 2 is of p-type conductivity. A PNP transistor embodiment is also possible. In the NPN transistor embodiment of FIGS. 1 and 2, the p-type zones 23, 24, 25 are comprised in the base region 1. In a PNP transistor embodiment, p-type zones 23', 24', 25' in accordance with the present invention may be comprised in the collector region 2'. In this case the uniformally low doped p-type zone 23' forms the collector junction 12" with the n-type base region 1', the high-doped p-type zone 25' is a collector contact zone, and the distinct additional p-type zone 24' (of an intermediate doping concentration which decreases towards zone 23') is present between zones 25' and 23'. Both zones 23' and 24' may be depleted by the depletion layer from the junction 12" in the off-state of this PNP transistor.

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any Claim and whether or not it mitigates any or all of the same technical problems as does the present invention. The Applicants hereby give notice that new claims may be formulated to such features and/or combinations of such features during prosecution of the present application or of any further application derived therefrom.

What is claimed is:

1. A semiconductor switch device in the form of a bipolar transistor comprising a semiconductor body in which a base region of a first conductivity type is present between emitter and collector regions that are of an opposite second conductivity type and that form respective emitter-base and base-collector p-n junctions with the base region, wherein the base region includes the following structure of three zones in between the emitter region and the collector region:
  a high-doped zone that has a higher doping concentration of the first conductivity type than a low-doped zone of the base region, and a distinct additional zone between the low-doped and high-doped zones,
  the low-doped zone comprises a body portion having a substantially uniform doping concentration of the first conductivity type which forms the base-collector p-n junction with the collector region,
  the higher doping concentration of the high-doped zone forms the emitter-base p-n junction with the emitter region and decreases towards the additional zone over a part of the thickness of the body, and
  the additional zone has an additional doping concentration of the first conductivity type which is lower than the doping concentration of the high-doped zone and which decreases towards the low-doped zone, the additional zone providing a path for extracting charge carriers from the low-doped zone when the transistor is being switched off.

2. A device as claimed in claim 1, wherein the low-doped zone of the base region has such a low doping concentration as to be depleted, when the transistor is operated in an off state, from the reverse-biased base-collector p-n junction across the thickness of the low-doped zone and into the additional zone of the base region.

3. A device as claimed in claim 1, wherein the additional zone of the base region has a maximum doping concentration that is at least an order of magnitude lower than the doping concentration of the high-doped zone and at least an order of magnitude higher than the doping concentration of the low-doped zone.

4. A device as claimed in claim 1, wherein the base-collector p-n junction is extended to a surface of the body which is adjoined by the base region, and an annular field-relief region of the second conductivity type is present in the low-doped zone of the base region between the additional zone of the base region and the extension of the p-n junction at said surface.

5. A device as claimed in claim 1, further characterised in that the substantially uniform doping concentration of the first conductivity type of the body portion extends into the collector region where it is overdoped by a doping concentration of the second conductivity type of the collector region thereby forming the base-collector p-n junction with the base region.

6. A device as claimed in claim 1, further characterised in that a groove that laterally surrounds the base region extends from a body surface through the body portion to an underlying portion of the collector region, and the substantially uniform doping concentration of the first conductivity type of the body portion is overdoped along side-walls of the groove with dopant characteristic of the second conductivity type thereby forming an annular region of the second conductivity type which reaches to the collector region of the second conductivity type so as to extend the base-collector p-n junction to the body surface.

7. A device as claimed in claim 1, wherein the first conductivity type is p-type, and the second conductivity type is n-type.

* * * * *